United States Patent
Brandman et al.

(10) Patent No.: US 7,904,783 B2
(45) Date of Patent: Mar. 8, 2011

(54) SOFT-INPUT SOFT-OUTPUT DECODER FOR NONVOLATILE MEMORY

(75) Inventors: Yigal Brandman, Los Altos Hills, CA (US); Kevin M. Conley, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 1142 days.

(21) Appl. No.: 11/536,327

(22) Filed: Sep. 28, 2006

(65) Prior Publication Data

US 2008/0082897 A1 Apr. 3, 2008

(51) Int. Cl.
*G11C 29/00* (2006.01)
*H03M 13/29* (2006.01)
*H03M 13/45* (2006.01)

(52) U.S. Cl. .......... 714/755; 714/773; 714/778; 714/780

(58) Field of Classification Search .................. 714/755, 714/773, 778, 780
See application file for complete search history.

(56) References Cited

U.S. PATENT DOCUMENTS

| | | | |
|---|---|---|---|
| 5,043,940 A | 8/1991 | Harari | 365/185.03 |
| 5,070,032 A | 12/1991 | Yuan et al. | 438/267 |
| 5,095,344 A | 3/1992 | Harari | 257/328 |
| 5,172,338 A | 12/1992 | Mehrotra et al. | 365/185.03 |
| 5,313,421 A | 5/1994 | Guterman et al. | 365/185.15 |
| 5,315,541 A | 5/1994 | Harari et al. | 365/185.13 |
| 5,343,063 A | 8/1994 | Yuan et al. | 257/317 |
| 5,532,962 A | 7/1996 | Auclair et al. | 365/201 |
| 5,570,315 A | 10/1996 | Tanaka et al. | 365/185.22 |
| 5,657,332 A | 8/1997 | Auclair et al. | 714/763 |
| 5,661,053 A | 8/1997 | Yuan | 438/257 |
| 5,774,397 A | 6/1998 | Endoh et al. | 365/185.19 |
| 5,909,449 A | 6/1999 | So et al. | 714/721 |
| 5,930,167 A | 7/1999 | Lee et al. | 365/185.03 |
| 6,046,935 A | 4/2000 | Takeuchi et al. | 365/185.03 |
| 6,222,762 B1 | 4/2001 | Guterman et al. | 365/185.03 |
| 6,279,133 B1 | 8/2001 | Vafai et al. | |
| 6,298,461 B1 * | 10/2001 | Tong et al. | 714/755 |
| 6,301,151 B1 | 10/2001 | Engh et al. | |
| 6,397,364 B1 | 5/2002 | Barkan | 714/746 |
| 6,456,528 B1 | 9/2002 | Chen | 365/185.03 |
| 6,467,062 B1 | 10/2002 | Barkan | 714/764 |
| 6,469,931 B1 | 10/2002 | Ban et al. | 365/185.08 |
| 6,522,580 B2 | 2/2003 | Chen et al. | 365/185.02 |

(Continued)

FOREIGN PATENT DOCUMENTS

EP 1137001 A1 9/2001

(Continued)

OTHER PUBLICATIONS

U.S. Appl. No. 60/779,044, filed Mar. 6, 2006, Litsyn et al, "Controller For a Multibit-Per-Cell Flash Memory Supporting Non-Bijective Mapping of Bits Sequences to Cell States", pp. 1-17.*

(Continued)

*Primary Examiner* — Stephen M Baker
(74) *Attorney, Agent, or Firm* — Weaver Austin Villeneuve & Sampson LLP

(57) ABSTRACT

In a nonvolatile memory system, data is read from a memory array and used to obtain likelihood values, which are then provided to a soft-input soft-output decoder. The soft-input soft-output decoder calculates output likelihood values from input likelihood values and from parity data that was previously added according to an encoding scheme.

19 Claims, 9 Drawing Sheets

U.S. PATENT DOCUMENTS

| | | | |
|---|---|---|---|
| 6,674,385 B2 | 1/2004 | Micheloni et al. | 341/155 |
| 6,680,986 B1 | 1/2004 | Hemmati | |
| 6,751,766 B2 | 6/2004 | Guterman et al. | 714/736 |
| 6,785,164 B2 | 8/2004 | Gonzalez et al. | 365/185.21 |
| 6,873,549 B2 | 3/2005 | Khalid et al. | 365/185.03 |
| 6,894,926 B2 | 5/2005 | Guterman et al. | 365/185.03 |
| 6,925,007 B2 | 8/2005 | Harari et al. | 365/185.15 |
| 6,941,412 B2 | 9/2005 | Gongwer et al. | 711/103 |
| 6,952,365 B2 | 10/2005 | Gonzalez et al. | 365/185.03 |
| 6,977,844 B2 | 12/2005 | Guterman et al. | 365/185.18 |
| 6,983,428 B2 | 1/2006 | Cernea | 716/1 |
| 6,988,233 B2 | 1/2006 | Kanai et al. | |
| 7,012,835 B2 | 3/2006 | Gonzalez et al. | 365/185.11 |
| 7,035,146 B2 | 4/2006 | Hemink et al. | 365/185.22 |
| 7,039,846 B2 * | 5/2006 | Hewitt et al. | 714/755 |
| 7,072,417 B1 * | 7/2006 | Burd et al. | 375/295 |
| 7,088,621 B2 | 8/2006 | Guterman et al. | 365/185.18 |
| 7,092,290 B2 | 8/2006 | Hemink | 365/185.18 |
| 7,139,192 B1 | 11/2006 | Wong | |
| 7,184,486 B1 * | 2/2007 | Wu et al. | 375/262 |
| 7,231,580 B2 | 6/2007 | Shiota et al. | |
| 7,249,289 B2 | 7/2007 | Muranaka et al. | |
| 7,338,781 B2 * | 3/2008 | Golz et al. | 435/69.1 |
| 7,388,781 B2 | 6/2008 | Litsyn et al. | |
| 7,424,648 B2 | 9/2008 | Honda | |
| 7,500,167 B2 | 3/2009 | Widdup | |
| 7,607,053 B2 | 10/2009 | Moelker | |
| 2003/0147277 A1 | 8/2003 | Hsu | |
| 2003/0217323 A1 | 11/2003 | Guterman et al. | |
| 2004/0034827 A1 | 2/2004 | Shen et al. | |
| 2005/0013171 A1 | 1/2005 | Ban et al. | |
| 2005/0157824 A1 | 7/2005 | Kuwazoe et al. | |
| 2005/0204212 A1 | 9/2005 | Noguchi et al. | 714/710 |
| 2005/0213393 A1 | 9/2005 | Lasser | 365/185.33 |
| 2006/0101193 A1 | 5/2006 | Murin | 711/103 |
| 2006/0107127 A1 | 5/2006 | Park et al. | |
| 2006/0114814 A1 | 6/2006 | Kasami et al. | |
| 2007/0086239 A1 | 4/2007 | Litsyn et al. | |
| 2007/0089034 A1 | 4/2007 | Litsyn et al. | |
| 2007/0124652 A1 | 5/2007 | Litsyn et al. | |
| 2007/0150790 A1 | 6/2007 | Gross et al. | 714/763 |
| 2007/0150791 A1 | 6/2007 | Gross et al. | 714/763 |
| 2007/0171714 A1 * | 7/2007 | Wu et al. | 365/185.09 |
| 2007/0171730 A1 | 7/2007 | Ramamoorthy et al. | |
| 2007/0208905 A1 | 9/2007 | Litsyn et al. | |
| 2007/0266295 A1 | 11/2007 | Conley | |
| 2007/0266296 A1 | 11/2007 | Conley | |
| 2007/0283227 A1 | 12/2007 | Sharon et al. | |
| 2008/0010581 A1 | 1/2008 | Alrod et al. | |
| 2008/0092014 A1 | 4/2008 | Brandman et al. | |
| 2008/0092015 A1 | 4/2008 | Brandman et al. | |
| 2008/0092026 A1 | 4/2008 | Brandman et al. | |
| 2008/0109702 A1 | 5/2008 | Brandman | |
| 2008/0109703 A1 | 5/2008 | Brandman | |
| 2008/0123419 A1 | 5/2008 | Brandman et al. | |
| 2008/0123420 A1 | 5/2008 | Brandman et al. | |
| 2008/0198650 A1 | 8/2008 | Shalvi et al. | |

FOREIGN PATENT DOCUMENTS

| | | |
|---|---|---|
| WO | W00/41507 | 7/2000 |
| WO | WO2007/133963 | 11/2007 |
| WO | WO2008/042593 | 4/2008 |
| WO | WO2008/042598 | 4/2008 |

OTHER PUBLICATIONS

Winstead, "Analog Soft Decoding for Multi-level Memories", 35th International Symposium on Multiple-Valued Logic, May 2005, pp. 132-137.*

U.S. Appl. No. 60/771,621, filed Feb. 8, 2006, Wu et al, "Increase Storage Capacity of Flash Memory Through Coding and Signal Processing", pp. 1-9.*

Nana et al, "Improved Decoding of LDPC Coded Modulations", IEEE Communications Letters, vol. 10, No. 5, May 2006, pp. 375-377.*

International Searching Authority Search Report mailed Mar. 17, 2008 in International Application No. PCT/US2007/078819.

Written Opinion of the International Searching Authority mailed Mar. 17, 2008 in International Application No. PCT/US2007/078819.

U.S. Appl. No. 11/383,401, filed May 15, 2006, Conley.

U.S. Appl. No. 11/383,405, filed May 15, 2006, Conley.

U.S. Appl. No. 11/536,286, filed Sep. 28, 2006, Brandman et al.

U.S. Appl. No. 11/536,347, filed Sep. 28, 2006, Brandman et al.

U.S. Appl. No. 11/536,372, filed Sep. 28, 2006, Brandman et al.

U.S. Appl. No. 11/556,615, filed Nov. 3, 2006, Brandman et al.

U.S. Appl. No. 11/556,626, filed Nov. 3, 2006, Brandman et al.

U.S. Appl. No. 11/556,632, filed Nov. 3, 2006, Brandman.

U.S. Appl. No. 11/556,636, filed Nov. 3, 2006, Brandman.

"Noisy Channel Coding Theorem", Wikipedia, http://en.wikipedia.org/wiki/Shannon%27s_theorem, downloaded Mar. 23, 2006, 3 pages.

"Convolutional Code", Wikipedia, http://en.wikipedia.org/wiki/Convolutional_code, downloaded Mar. 23, 2006, 2 pages.

"Turbo Code", Wikipedia, http://en.wikipedia.org/wiki/Turbo_code, downloaded Mar. 23, 2006, 4 pages.

Chip Fleming, "A Tutorial on Convolutional Coding with Viterbi Decoding," http://home.netcom.com/~chip.f/viterbi/tutorial.html, dated Jan. 31, 2003, downloaded Mar. 23, 2006, 5 pages.

"Error Correcting Codes", http://www.dcs.ed.ac.uk/home/stg/pub/E/ecc.html, downloaded Mar. 18, 2006, 2 pages.

Bernard Sklar, "Fundamentals of Turbo Codes," Prentice Hall, Mar. 15, 2002, 30 pages.

R.Y.S. Tee et al., "Generalized Low-Density Parity-Check Coding Aided Multilevel Codes," IEEE, 2006, 5 pages.

U.S. Office Action dated Feb. 19, 2010 in U.S. Appl. No. 11/536,286.

International Search Report mailed Apr. 25, 2008 in International Application No. PCT/US2007/078841.

Written Opinion mailed Apr. 25, 2008 in International Application No. PCT/US2007/078841.

EP Examination Report mailed Oct. 9, 2009 in Application No. 07814918.4.

U.S Office Action mailed Dec. 29, 2009 in U.S. Appl. No. 11/536,347.

U.S Office Action mailed Jan. 28, 2010 in U.S. Appl. No. 11/536,372.

* cited by examiner

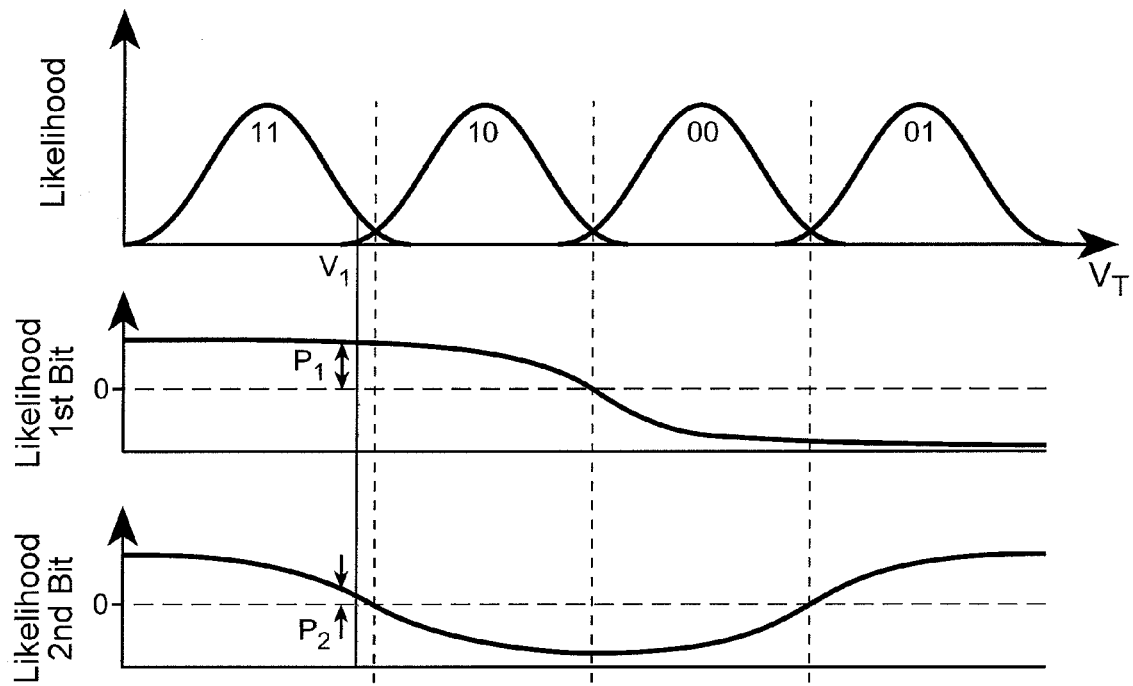
FIG. 7
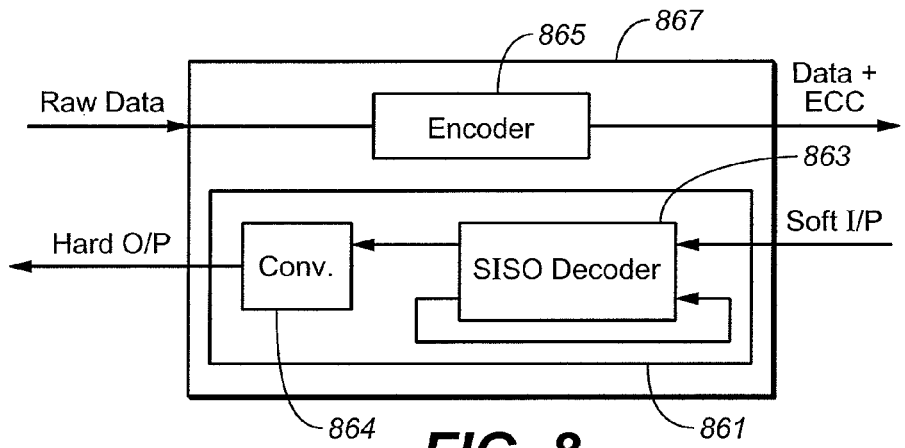
FIG. 8
$$\begin{array}{cccc} D_{11} & D_{12} & D_{13} & P_1 \\ D_{21} & D_{22} & D_{23} & P_2 \\ D_{31} & D_{32} & D_{33} & P_3 \\ P_4 & P_5 & P_6 & P_7 \end{array}$$
FIG. 9

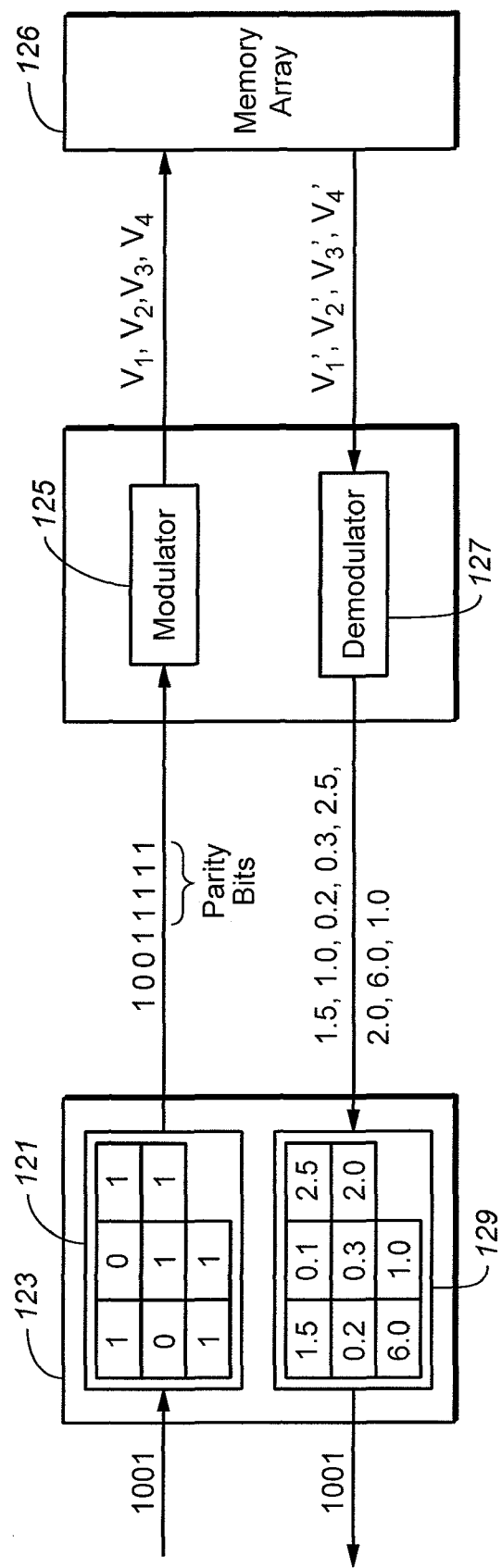

$$H = \begin{bmatrix} 1 & 1 & 0 & 1 & 0 & 0 & 0 \\ 0 & 1 & 1 & 0 & 1 & 0 & 0 \\ 0 & 0 & 1 & 1 & 0 & 1 & 0 \\ 0 & 0 & 0 & 1 & 1 & 0 & 1 \\ 1 & 0 & 0 & 0 & 1 & 1 & 0 \\ 0 & 1 & 0 & 0 & 0 & 1 & 1 \\ 1 & 0 & 1 & 0 & 0 & 0 & 1 \end{bmatrix}$$

SOFT-INPUT SOFT-OUTPUT DECODER FOR NONVOLATILE MEMORY

CROSS-REFERENCE TO RELATED APPLICATIONS

This application is related to U.S. patent application Ser. No. 11/536,286, filed Sep. 28, 2006, entitled, "Methods of Soft-Input Soft-Output Decoding for Nonvolatile Memory"; and to U.S. patent application Ser. No. 11/536,347, filed Sep. 28, 2006, entitled "Methods of Adapting Operation of Nonvolatile Memory"; and to U.S. patent application Ser. No. 11/536,372, filed Sep. 28, 2006, entitled "Nonvolatile Memory with Adaptive Operation", all of which are filed on the same day as the present application. These applications are incorporated in their entirety by reference as if fully set forth herein.

BACKGROUND OF THE INVENTION

This invention relates to nonvolatile memory systems and to methods of operating nonvolatile memory systems.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Data stored in a nonvolatile memory system may contain erroneous bits when data is read. Traditional ways to reconstruct corrupted data include the application of Error Correction Codes (ECCs). Simple Error Correction Codes encode data by storing additional parity bits, which set the parity of groups of bits to a required logical value, when the data is written into the memory system. If during storage the data is erroneous, the parity of groups of bits may change. Upon reading the data from the memory system, the parity of the group of the bits is computed once again by the ECC. Because of the data corruption the computed parity may not match the required parity condition, and the ECC may detect the corruption.

ECCs can have at least two functions: error detection and error correction. Capability for each of these functions is typically measured in the number of bits can be detected as erroneous and subsequently corrected. Detection capability can be the same or greater than the correction capability. A typical ECC can detect a higher number of error bits than it can correct. A collection of data bits and parity bits is sometimes called a word. An early example is the (7,4) Hamming code, which has the capability of detecting up to two errors per word (seven bits in this example) and has the capability of correcting one error in such a seven-bit word.

More sophisticated ECCs can correct more than a single error per word, but it becomes computationally increasingly complex to reconstruct the data. Common practice is to recover the data with some acceptably small likelihood of incorrect recovery. However with increasing number of errors the probability of reliable data recovery also decreases rapidly or the associated costs in additional hardware and/or performance become prohibitively high.

In semiconductor memory devices, including EEPROM systems, data can be represented by the threshold voltages of transistors. Typically, different digital data storage values correspond to different voltage ranges. If, for some reason, before or during the read operation the voltage levels shift from their programmed ranges, an error occurs. The error may be detected by the ECC and in some cases these errors may be corrected.

SUMMARY OF THE INVENTION

A nonvolatile memory array is connected to a decoder so that encoded data read from the memory array is used to calculate likelihood values associated with bits stored in the memory array. An example of such a decoder is a Soft-Input Soft-Output (SISO) decoder. The encoded data may be read with a high resolution that gives an indication of likelihood associated with a data bit, not just the logical value of the data bit. For example, where binary data is encoded as +1/−1 volt in a memory, the actual voltage read may be used by the ECC decoder instead of just the sign. Likelihood values may be derived from the values read or other sources. Likelihood values may be provided as a soft-input to a SISO decoder. The output of the SISO decoder may be converted to a hard-output by a converter. The hard-output represents corrected data. In some cases, a SISO decoder may perform calculations in multiple iterations until some predetermined condition is met.

In a nonvolatile memory, a high resolution read may be achieved by selecting appropriate voltages for individual read steps so that a higher density of reads occurs for a certain portion of a particular threshold voltage function than occurs at another portion. This provides additional resolution for areas of interest, for example, where threshold voltage functions have significant overlap.

In a nonvolatile memory, a demodulator may convert voltages from a memory array into likelihood values Where more than one bit is stored in a cell, a separate likelihood value may be obtained for each bit. Such likelihood values may be used as a soft-input for a SISO decoder.

BRIEF DESCRIPTION OF THE DRAWINGS

FIG. 7 shows individual likelihood values for both a first and a second bit as a function of threshold voltage in a memory that stores two bits per cell.

FIG. 8 shows an encoder/decoder unit having a Soft-Input Soft-Output (SISO) decoder.

FIG. 9 shows an exemplary encoding scheme where the input data is arranged in a square matrix and a parity bit is calculated for each row and column.

FIG. 11 shows an alternative encoding scheme where parity bits are calculated for input data, the input data arranged in rows and columns, a parity bit calculated for each row and column.

FIG. 12 shows components of a memory system including an encoder that provides the encoding shown in FIG. 11 and a demodulator that provides raw likelihood values to a SISO decoder.

DETAILED DESCRIPTION OF ILLUSTRATED EMBODIMENTS

Figure 1:
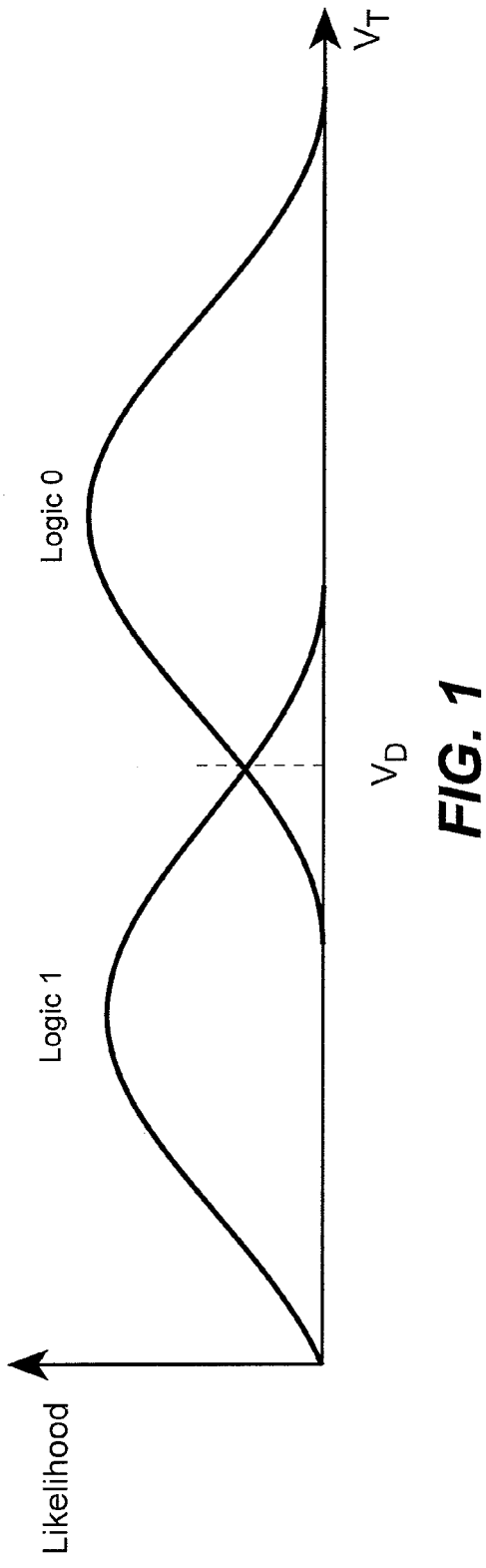
FIG. 1 shows likelihood functions of threshold voltages of cells programmed to a logic 1 state and a logic 0 state in a nonvolatile memory, including a voltage $V_D$ used to discriminate logic 1 and logic 0 states.

In many nonvolatile memories, data read from a memory array may have errors. That is, individual bits of input data that are programmed to a memory array may later be read as being in a different logical value. FIG. 1 shows the relationship between a physical parameter indicating a memory cell state (threshold voltage, $V_T$) and the logical values to which the memory cell may be programmed. In this example, only two states are stored in the cell. Thus, the cell stores one bit of data. Cells programmed to the logic 0 state generally have a higher threshold voltage than cells in the logic 1 (unprogrammed) state. In an alternative scheme, the logic 1 state is the unprogrammed state of the memory cell. The vertical axis of FIG. 1 indicates the likelihood of reading a cell at any particular threshold voltage based upon expected threshold voltage distribution. A first likelihood function is shown for cells programmed to logic 1 and a second for cells programmed to logic 0. However, these functions have some degree of overlap between them. A discrimination voltage $V_D$ is used in reading such cells. Cells having a threshold voltage below $V_D$ are considered to be in state 1, while those having a threshold voltage above $V_D$ are considered to be in state 0. As FIG. 1 shows, this may not always be correct. Because of the overlap between functions, there is a non-zero likelihood that a memory cell programmed to a logic 1 state will be read as having a threshold voltage greater than $V_D$ and so will be read as being in a logic 0 state. Similarly, there is a non-zero likelihood that a memory cell programmed to a logic 0 state will be read as having a logic 1 state.

Overlap between functions occurs for a number of reasons including physical defects in the memory array and disturbance caused to programmed cells by later programming or reading operations in the memory array. Overlap may also occur due to a general lack of ability to keep a large number of cells within a very tight threshold voltage range. Certain programming techniques may allow functions of threshold voltages to be narrowed (have smaller standard deviations). However, such programming may take more time. In some memory systems, more than one bit is stored in a memory cell. In general, it is desirable to store as many bits as possible in a memory cell. In order to efficiently use the available threshold voltage range, functions for adjacent states may be such that they significantly overlap.

Nonvolatile memory systems commonly employ ECC methods to overcome errors that occur in data that is read from a memory array. Such methods generally calculate some additional ECC bits from input data to be stored in a memory array according to an encoding system. Other ECC schemes may map input data to output data in a more complex way. The ECC bits are generally stored along with the input data or may be stored separately. The input data and ECC bits are later read from the nonvolatile memory array together and a decoder uses both the data and ECC bits to check if any errors are present. In some cases, such ECC bits may also be used to identify a bit that is in error. The erroneous bit is then corrected by changing its state (changed from a "0" to a "1" or from a "1" to a "0"). Appending ECC bits to data bits is not the only way to encode data before storing it in a nonvolatile memory. For example, data bits may be encoded according to a scheme that provides the following transformations: 00 to 1111, 01 to 1100, 10 to 0011 and 11 to 0000.

Figure 2:
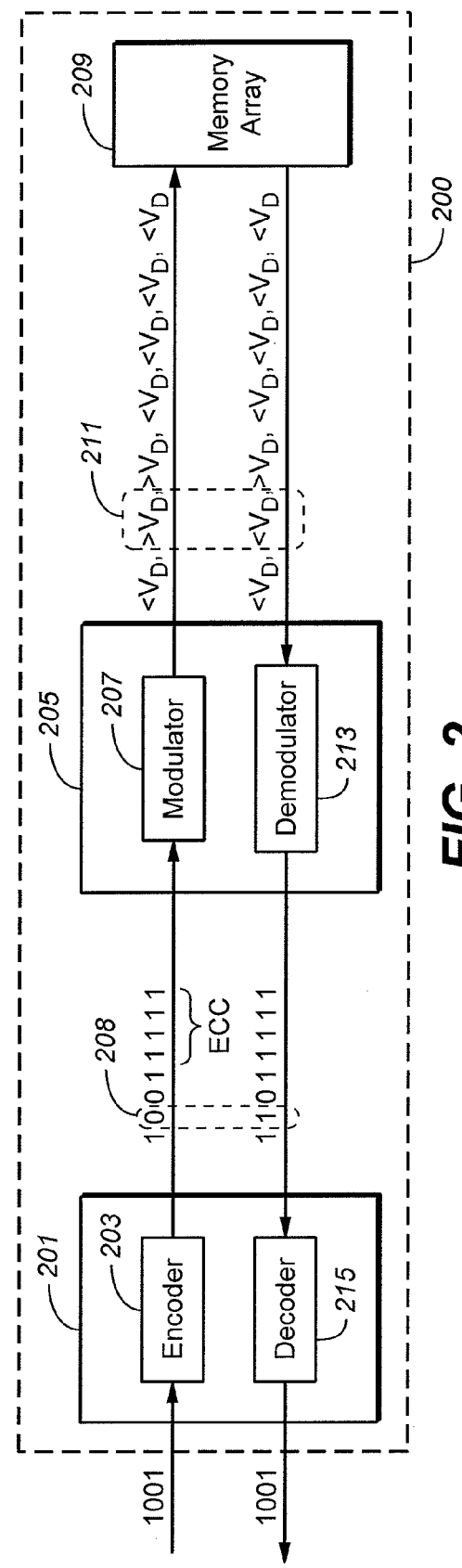
FIG. 2 shows components of a memory system including a memory array, modulator/demodulator circuits and encoder/decoder circuits.

FIG. 2 shows an example of input data being stored in a memory system 200. Input data is first received by an ECC unit 201 that includes an encoder 203. The input data may be host data to be stored in memory system 200 or may be data generated by a memory controller. The example of FIG. 2 shows four input data bits 1001. Encoder 203 then calculates ECC bits (1111) from the input data bits using an encoding scheme. One example of an encoding scheme is to generate ECC bits that are parity bits for selected groups of data bits.

Both the input data bits and the ECC bits are then sent to a modulation/demodulation unit 205 that includes a modulator 207. Modulator 207 converts the digital data sent by ECC unit 201 to a form in which it is written in a memory array 209. In one scheme, the digital data is converted to a plurality of threshold voltage values in a plurality of memory cells. Thus, various circuits used to convert digital data to a stored threshold voltage in a memory cell may be considered to form a modulator. In the example of FIG. 2, each memory cell may hold one bit of data. Thus, each memory cell may have a threshold voltage in one of two ranges, one signifying a logic "1" state and the other signifying a logic "0" state as shown in FIG. 1. The memory cells storing a logic "1" state have a threshold voltage that is less than $V_D$ ($<V_D$) while the memory cells storing a logic "0" state have a threshold voltage that is greater than $V_D$ ($>V_D$). Cells may be programmed and verified to a nominal threshold voltage higher than $V_D$ to ensure that, at least initially, there is some preferred separation between cells programmed to the two logic states.

Data may be stored in memory array 209 for some period of time. During this time, various events may occur to cause threshold voltages of memory cells to change. In particular, operations involving programming and reading may require voltages to be applied to word lines and bit lines in a manner that affects other previously programmed cells. Such disturbs are particularly common where dimensions of devices are reduced so that the interaction between adjacent cells is significant. Charge may also be lost over long periods of time. Such data retention failures can also cause data to change when read. As a result of such changes, data bits may be read out having different states than the data bits originally programmed. In the example of FIG. 2, one input data bit 211 is read as having a threshold value less than $V_D$ ($<V_D$) when it was originally written having a threshold value greater than $V_p$ ($>V_D$).

The threshold voltages of memory cells are converted to bits of data by a demodulator 213 in modulation/demodulation unit 205. This is the reverse of the process performed by the modulator. Demodulator 213 may include sense amplifiers that read a voltage or current from a memory cell in memory array 209 and derive the state of the cell from the reading. In the example of FIG. 2, a memory cell having a threshold voltage less than $V_D$ ($<V_D$) gives a demodulated output of "1" and a memory cell having a threshold voltage that is greater than $V_D$ ($>V_D$) gives a demodulated output of "0." This gives the output sequence 11011111 shown. The second bit 208 of this sequence is in error as a result of being stored in the memory array 209.

The output of demodulator 213 is sent to a decoder 215 in the ECC unit 201. Decoder 215 determines from data bits and ECC bits if there are any errors. If a small number of errors is present that is within the correction capability of the code, the errors are corrected. If large numbers of errors are present, they may be identified but not corrected if they are within the detection capability of the code. If the number of errors exceeds the detection capability of the code, the errors may not be detected, or may result in an erroneous correction. In the example of FIG. 2, the error in the second bit is detected and is corrected. This provides an output (1001) from decoder 215 that is identical to the input sequence. The decoding of memory system 200 is considered to be hard-input hard-output decoding because decoder 215 receives only data bits representing input data bits and ECC bits, and decoder 215 outputs a corrected sequence of data bits corresponding to input data bits (or fails to give an output if the number of errors is too high).

Figure 3:
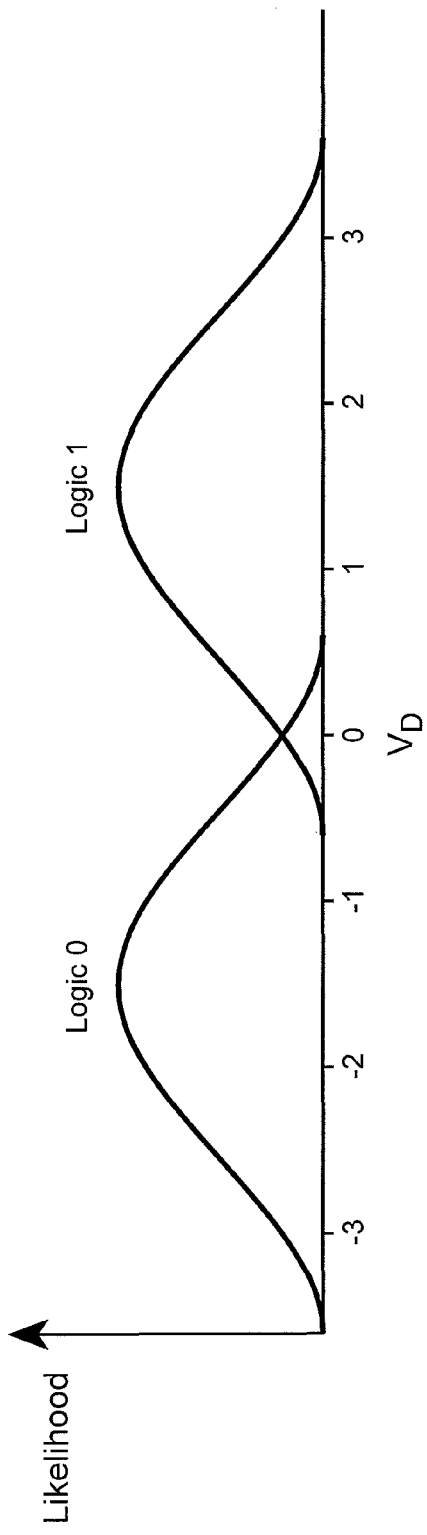
FIG. 3 shows likelihood function of read threshold voltages of cells programmed to a logic 1 state and a logic 0 state, showing threshold voltage values.
Figure 4:
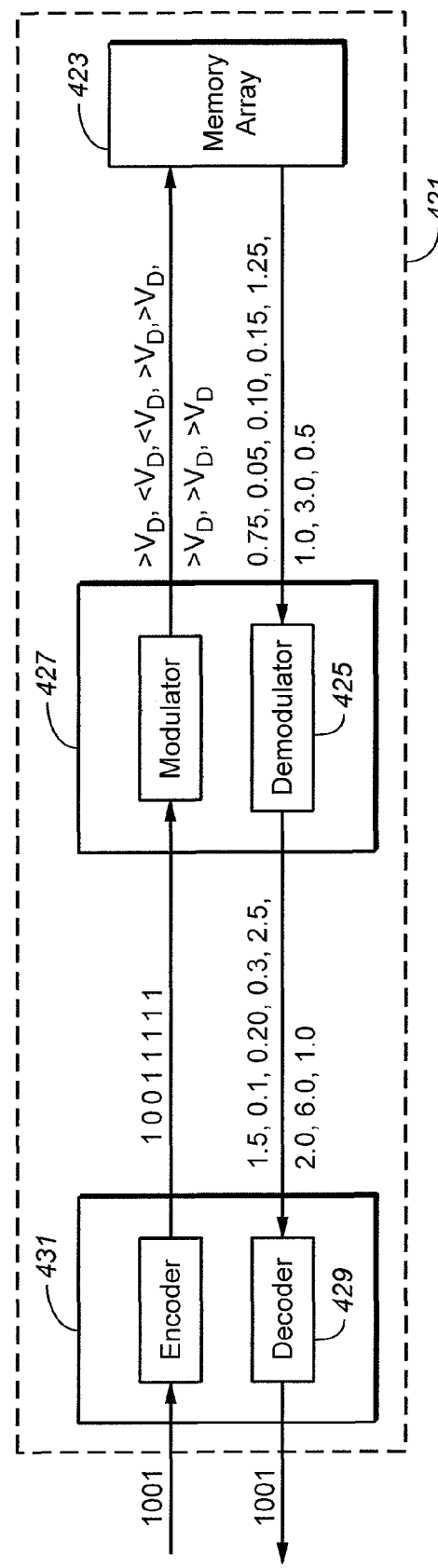
FIG. 4 shows components of a memory system including a memory array, modulator/demodulator circuits and encoder/decoder circuits, a demodulator providing likelihood values to a decoder.

An alternative memory system to memory system 200 is shown in FIGS. 3 and 4. FIG. 3 shows similar functions to those of FIG. 1 with $V_D$=0 and with threshold voltages below $V_D$ representing logic 0 and voltages above $V_D$ representing logic 1. Instead of showing a single voltage $V_D$ dividing threshold voltages into two different ranges, here the threshold voltages are indicated by actual voltage numbers. The function corresponding to logic "1" is centered above 0 volts and the function corresponding to logic "0" is centered below 0 volts.

FIG. 4 shows a memory system 421 using a data storage process that is similar to that of memory system 200 (using the same input data bits and ECC bits) with a different read process. In particular, instead of simply determining whether a threshold voltage is above or below a particular value, memory system 421 reads threshold voltages as shown in FIG. 3. It will be understood that actual threshold voltage is not necessarily read. Other means of cell operation may be used to store and retrieve data (e.g. current sensing). Voltage sensing is merely used as an example. Generally, threshold voltage refers to a gate voltage at which a transistor turns on. FIG. 4 shows a read occurring that provides more detailed information than the previous example. This may be considered a read with a higher resolution than that of FIG. 2 (and a resolution that resolves more states than are used for programming). As in the previous example, errors occur in the read data. Here, the readings corresponding to the second and third bits are in error. The second and third bits were logic "0" and were stored by programming a cell to have a threshold voltage less than $V_p$ but the cells are read as having threshold voltages of 0.05 volts and 0.10 volts which is higher than $V_D$ ($V_D$=0 volts).

The raw voltages read from memory array 423 of FIG. 4 by a series of read operations are sent to a demodulator 425 in a modulation/demodulation circuit 427. The raw voltages have a finite resolution dictated by the resolution of the Analog-to-Digital conversion. Here, raw data is converted into likelihood data. In particular, each cell reading is converted into a likelihood that the corresponding bit is a one or a zero. The series of readings from the memory array (0.75, 0.05, 0.10, 0.15, 1.25, 1.0, 3.0, and 0.5 volts) can indicate not only the state of the cell, but can also be used to provide a degree of certainty as to that state. This may be expressed as a likelihood that a memory cell was programmed with a particular bit. Thus, readings that are close to 0 volts may give low likelihood values, while readings that are farther from 0 volts give higher likelihood values. The likelihood values shown are log likelihood ratios (explained in detail below). This provides negative numbers for cells in a logic 0 state and positive numbers for cells in a logic 1 state, with the magnitude of the number indicating the likelihood that the state is correctly identified. The second and third likelihood values (0.1, 0.2) indicate logic "1". The second and third values indicate likelihoods that are quite low.

Likelihood values are sent to a decoder 429 in an ECC unit 431 (in some cases, obtaining likelihood values from raw values may be considered as being performed in the decoder). The decoder 429 performs decoding operations on likelihood values. Such a decoder may be considered a soft-input decoder. In general, soft-input refers to an input that includes some quality information related to data that are to be decoded. The additional information provided as a soft-input generally allows a decoder to obtain better results. A decoder may perform decoding calculations using a soft-input to provide calculated likelihood values as an output. This is considered a soft-output and such a decoder is considered a Soft-Input Soft-Output (SISO) decoder. This output can then be used again as input to the SISO decoder to iterate the decoding and improve results. A SISO decoder may form part of a larger decoder that provides a hard output to another unit. SISO decoders generally provide good performance and in some cases may provide better performance than is possible with hard-input hard-output decoding. In particular, for the same amount of overhead (number of ECC bits) a SISO decoder may provide greater error correction capability. In order to efficiently use a SISO decoder, a suitable encoding/decoding scheme may be implemented and demodulation is adapted to efficiently obtain a soft-input without excessive complexity and without requiring excessive time for reading data from the memory array.

In one embodiment, a soft-input for a SISO decoder is provided by reading data in a nonvolatile memory array with a resolution that resolves a larger number of states than were used in programming the memory. Thus, data may be written by programming a memory cell to one of two threshold voltage ranges and subsequently read by resolving three or more threshold voltage ranges. Typically, the number of threshold voltage ranges used in reading will be some multiple of the number of threshold voltage ranges used in programming (for example, twice as many). However, this is not always the case.

An encoder/decoder circuit (ECC unit) may be formed as a dedicated circuit or may this function may be performed by firmware in a controller. Typically, a controller is an Application Specific Integrated Circuit (ASIC) that has circuits designed for specific functions such as ECC and also has firmware to manage controller operations. Thus, an encoder/decoder may be formed by a combination of hardware and firmware in the memory controller. The modulator/demodulator circuits may be on a memory chip, on a controller chip, on a separate chip or some combination. Generally, modulation circuits will include at least some components on the memory chip (such as peripheral circuits connected to a memory array). While FIG. 4 indicates threshold voltages being read to a high resolution (an analog read), the degree of resolution chosen may depend on a number of factors including the type of nonvolatile memory used.

Figure 5:
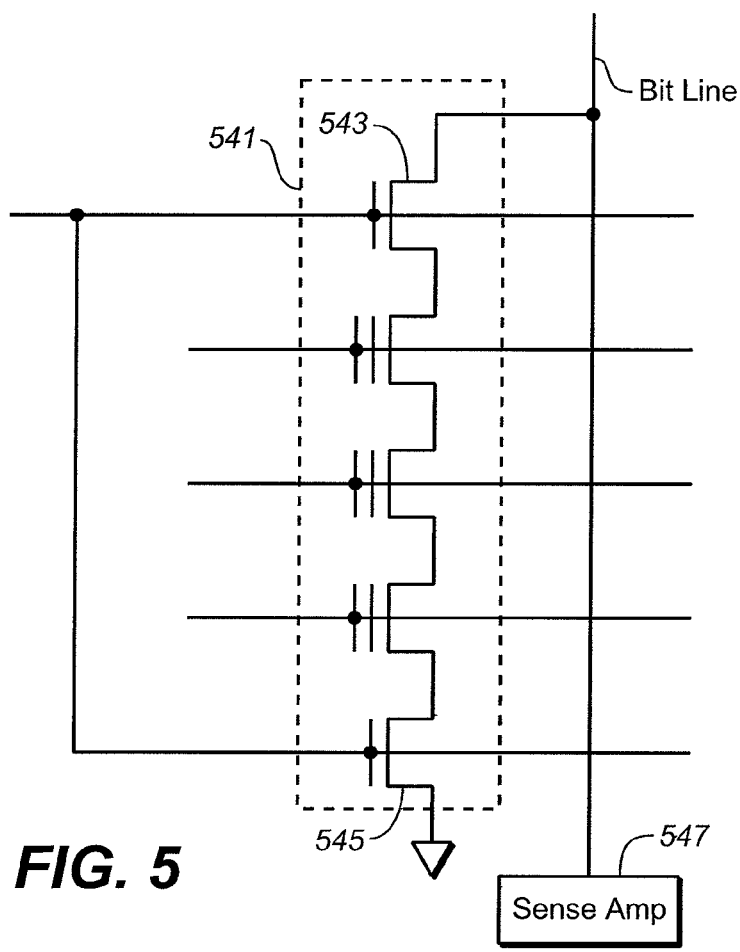
FIG. 5 shows a NAND string connected to a sense amplifier to read the state of a memory cell.

FIG. 5 shows a string 541 of a NAND flash memory array undergoing a read operation. A NAND flash memory is comprised of strings of memory cells connected in series, isolated by select transistors in groups collectively called blocks, the basic unit of erase. In order to read the selected cell, the other cells of the string are turned on hard so that the current flowing through the sting depends on the selected cell. Appropriate bias voltages are placed on the gates of the string select transistors 543, 545 at either end of string 541 (typically, one end is connected to ground) and one or more voltages are sequentially applied to the word line that extends over the selected cell. For a cell holding one bit of data, only a single voltage may be needed. For cells holding more than one bit (Multi Level Cells, or MLC), a voltage sequence typically consists of sequentially increasing voltage steps or a binary search pattern. Each step corresponds to a discrimination voltage. A cell storing two bits requires four states and a cell storing three bits requires eight states etc. A sense amplifier 547 attached to a bit line determines when the cell switches on and the word line voltage that first causes such switching indicates the threshold voltage range of the cell. The resolution of the read operation depends on the number of voltage steps provided. For example, a single bit read may require 25 microseconds to complete a sensing operation, while a two bit read for the same memory requires 75 microseconds to complete the three sensing operations to fully resolve four states. More voltage steps provide a higher resolution but this requires more time. Fewer voltage steps increase speed but provide poorer resolution. Typically, read operations are performed with the same resolution used to perform program operations. Thus, if a program operation programs and verifies cells to one of four states, the read operation has sufficient resolution to resolve four threshold voltage ranges. This may require three voltage steps for a cell that has four possible states. Various structures of NAND flash memory systems and methods of operating NAND flash memory systems are described in U.S. Pat. Nos. 7,088,621; 7,092,290 and 6,983,428.

Figure 6A:
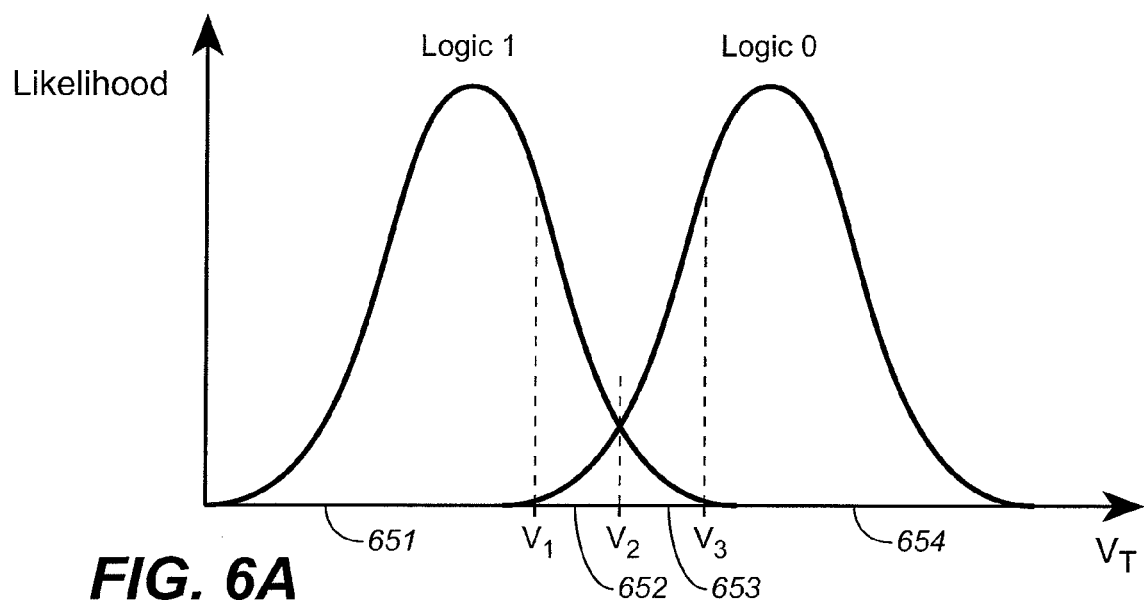
FIG. 6A shows likelihood functions of read threshold voltages of cells programmed to a logic 1 state and a logic 0 state including three threshold voltages.

FIG. 6A shows as example of a single-bit memory cell that is read with a high resolution that resolves more states than the number of states used in programming the memory. As before, the horizontal axis indicates threshold voltage ($V_T$) and the vertical axis indicates likelihood of a cell having this threshold voltage for a given programmed state. In the example of FIG. 1 a single read was performed to determine if a cell was programmed into one of two states. In contrast, here three reads are performed to determine if the cell is in one of four read threshold voltage ranges, 651-654. Thus, the cell is programmed to one of two threshold voltage ranges (corresponding to two logic states) and is later read with a resolution that identifies the cell as being in one of four threshold voltage ranges (four read states).

Voltages $V_1$, $V_2$, $V_3$ chosen for performing reads are such that the four threshold voltage ranges 651-654 are not equal in size and reads are concentrated near where the two functions (for logic 1 and logic 0) overlap. One read (at a discrimination voltage $V_2$) is similar to that of FIG. 1 and indicates which state (0 or 1) the memory cell is in. The other two reads (at $V_1$ and $V_3$) are within the threshold voltage ranges of logic 0 and logic 1 but are not centered in these threshold voltage ranges. Instead, these reads are arranged closer to $V_2$. The four read threshold voltage ranges 651-654 give an indication of the likelihood that a particular read bit is correct. Thus, for a logic 0, a reading below $V_1$ (threshold voltage range 651) has a high likelihood of being correct, while a reading between $V_1$ and $V_2$ (threshold voltage range 652) has a lower likelihood of being correct. For logic 1, a reading between $V_2$ and $V_3$ (threshold voltage range 653) has a comparatively low likelihood of being correct, while a reading above $V_3$ (threshold voltage range 654) has a higher likelihood of being correct. It can be seen that reading with a resolution that resolves a higher number of states than were used in programming allows a read operation to obtain likelihood information regarding the data being read.

Figure 6B:
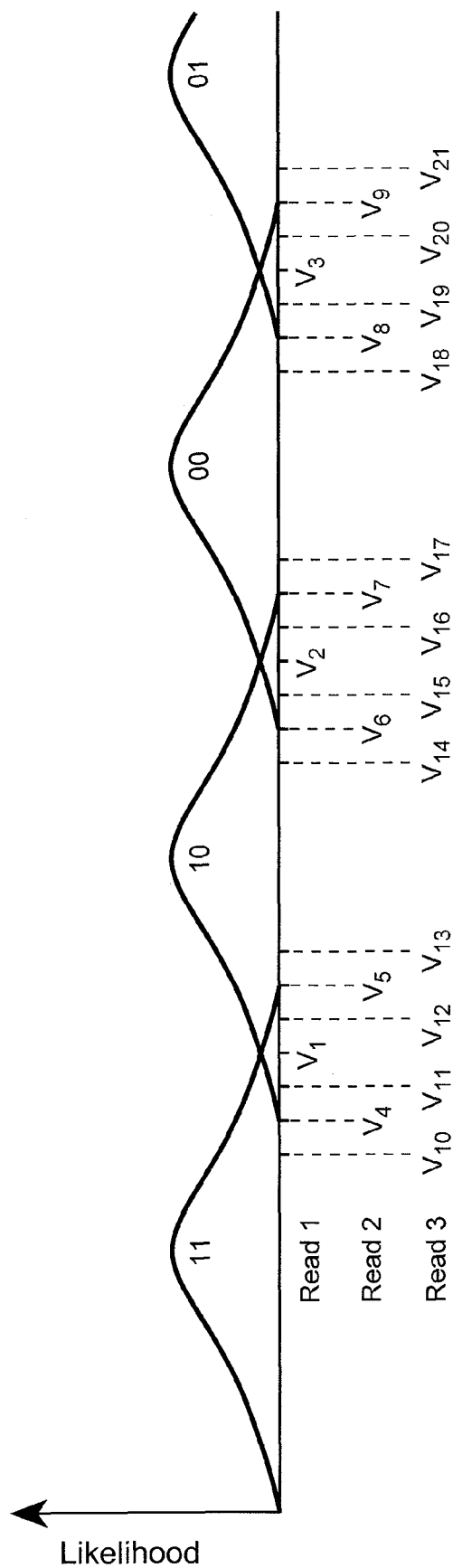
FIG. 6B shows likelihood functions of read threshold voltages of cells programmed to four states and shows threshold voltages where cells are read.

FIG. 6B shows an example of a two-bit MLC memory cell being read with a high resolution that resolves more states than the number of programmed states. FIG. 6B shows a series of read operations being performed with increasing resolution. During READ 1, the threshold voltage of the cell is resolved into one of four states corresponding to a threshold voltage less than $V_1$, between $V_1$ and $V_2$, between $V_2$ and $V_3$, and greater than $V_3$. This first read resolves the same number of states as were used in programming. A second read READ 2 is performed to give a higher resolution. READ 2 resolves a programmed state such as "10" into three read states that correspond to a central portion of the threshold voltage function (between $V_5$ and $V_6$) and two outer portions of the threshold voltage function (one between $V_1$ and $V_5$, the other between $V_6$ and $V_2$). A third read, READ 3, is performed to give higher resolution again. READ 3 resolves the read states of READ 2 so that outer portions are further resolved. In this example, read states corresponding to central portions are not further resolved. The read operations may be performed in the order READ 1, then READ 2, then READ 3 or in any other order. Alternatively, individual read steps may be performed in some other order so that they are combined in a single read operation. For example, read steps may be performed starting from the lowest threshold voltage and going up sequentially according to threshold voltage. The read steps of READ 1, READ 2 and READ 3 are arranged in a pattern having a higher density of read operations for outer portions of the threshold voltage function of a particular programmed state than for a central portion. This provides more information regarding outer portions of threshold voltage functions than central portions of such functions. This is because a cell having a threshold voltage in a central portion of a threshold voltage function for a particular state may be assumed to have a high likelihood of being in that state (close to zero likelihood of being in another state) so that further resolution is not required. Outer portions of a particular function may overlap a neighboring function. More information about such an overlap region (where likelihood values change) is desirable.

The above description relates to particular techniques for reading NAND flash memory cells. Other reading techniques may also be used. In some memories, a single read step may provide information regarding the programmed level of a memory cell. For example, in some NOR flash memories, the state of a memory cell is read by measuring the current through the cell under certain biasing conditions. In such a memory, a current mirror can be used to replicate the current from the cell, the replicated current can then be compared with several reference currents in parallel. Thus, a high resolution read may be performed in a single step.

FIG. 7 shows how likelihood values related to individual bits may be derived from threshold voltage information from a cell storing more than one bit of data. In this case, individual likelihood values are assigned to each bit. FIG. 7 shows a likelihood function for the four states (11, 10, 00, 01) of FIG. 6. FIG. 7 also shows a likelihood across all four threshold voltage ranges for the first bit (leftmost bit). Likelihood here is shown as the likelihood that a particular bit is a "1," likelihood could also be given in terms of likelihood that a bit is a "0." A likelihood level of 0 is shown. This is the level at which there is an equal likelihood of a 1 or a 0. Below the 0 level, there is a larger likelihood of a 0. Because the two states on the left "11" and "10" both have a "1" as the first bit, the likelihood on the left of this graph is high (>0). The two states on the right "00" and "01" both have a "0" as the first bit, so the likelihood on this side is low (<0). FIG. 7 also shows a likelihood across all four threshold voltage ranges for the second bit (rightmost bit). This likelihood is high at either end of the threshold voltage range and low in the middle. Thus, the likelihood values for the two bits have very different patterns. FIG. 7 shows a threshold voltage V1 that gives a first-bit likelihood P1 and a second bit likelihood P2. Here, P1 is large because threshold voltage V1 is not close to a threshold voltage associated with a state having a "0" as the first bit. However, P2 is small because V1 is close to the threshold voltage range for the "10" state. This indicates that, while this bit is probably a 1, the likelihood is little higher than the likelihood that it is a 0. FIG. 7 shows that likelihood may be very different for different bits stored in the same cell. Even where a read operation indicates a threshold voltage that is in a region of overlap between threshold voltage ranges of neighboring states and thus has an increased risk of being misread, an individual bit may have a very high likelihood value where the overlap is between two states that both have the individual bit in common. Thus, it may be beneficial to determine likelihood on a bit-by-bit basis instead of a cell-by-cell basis. A demodulator may use correlation between threshold voltage and individual bit likelihood values like those shown in FIG. 7 to provide raw likelihood values based on readings from a memory array. Where a read operation identifies a threshold voltage range for a cell, likelihood values for each bit may be associated with each such range. Likelihood values may be derived from a variety of information such as characteristics of memory cell behavior for a given technology or from experience of a given memory device. In some cases, likelihood values may vary at different stages during the lifetime of a device.

Likelihood may be expressed in different ways. One common way to express likelihood for binary data is as a Log Likelihood Ratio (LLR). The LLR associated with a particular bit is the log of the ratio of the likelihood that the bit is a "1" to the likelihood that the bit is a "0" for a particular reading x. Thus:

$$LLR(x) = \log\left(\frac{P(d=1|x)}{P(d=0|x)}\right)$$

where $P(d=1|x)$ is the likelihood that the bit is a "1" and $P(d=0|x)$ is the likelihood that the bit is a "0." LLR is a convenient way to express likelihood though other systems may also be used. In order to obtain likelihood information from readings from a memory, some conversion or demodulation is generally performed. One convenient manner of performing such demodulation is to use a lookup table that tabulates the relationship between threshold voltage (or some measured parameter in the memory) and the likelihood values of one or more bits. Where the resolution of the read operation divides the threshold voltage range of a memory cell into N read states and the cell stores R bits, a table may have N×R entries so that a likelihood is given for each bit for each read state. In this way, a high resolution read may provide likelihood information regarding data stored in the memory. Such raw likelihood data may be provided to a decoder as a soft-input to the decoder.

FIG. 8 shows soft-input data such as described above being supplied to a decoder system 861 that includes a SISO decoder 863. SISO decoders generally accept raw likelihood data and perform ECC calculations on the raw likelihood data to provide calculated likelihood data. The calculated likelihood data may be considered a soft-output. In many cases, such a soft-output is then provided as an input to the SISO decoder so that a second decoding iteration is performed. A SISO decoder may perform successive iterations until at least one predetermined condition is achieved. For example, a predetermined condition may be that all bits have a likelihood that is greater than a certain minimum value. A predetermined condition could also be an aggregate of likelihood values such as a mean likelihood value. A predetermined condition may be convergence of results from one iteration to the next (i.e. keep iterating until there is little improvement from additional iterations). A predetermined condition may be that a predetermined number of iterations are completed. Combinations of these conditions may also be used. Decoding is performed using an encoded pattern in the data that is the result of encoding performed by encoder 865 on the data before it was stored. Encoder 865 and decoder system 861 are both considered parts of ECC unit 867, which may be implemented in a memory system such as memory system 421 (ECC unit 867 is an example of a unit that may be used as ECC unit 431). Various encoding schemes are possible for use with a SISO decoder. Decoder 861 also includes a hart-soft converter 864 to convert a soft-output from SISO decoder 865 to a hard output.

In some cases, SISO decoding may give better error correction for the same amount of overhead data than hard-input hard-output decoding does. FIG. 9 shows an exemplary encoding scheme that may be used in a SISO decoder such as SISO decoder 863. Data entries $D_{11}$-$D_{33}$ are arranged in rows and columns with parity bits calculated for each row and column. For example, $P_1$ is calculated from the row comprising entries $D_{11}$, $D_{12}$ and $D_{13}$. Similarly, $P_2$ is calculated from the row comprising entries $D_{21}$, $D_{22}$ and $D_{23}$. $P_4$ is calculated from the column $D_{11}$, $D_{21}$ and $D_{23}$.

Figure 10:
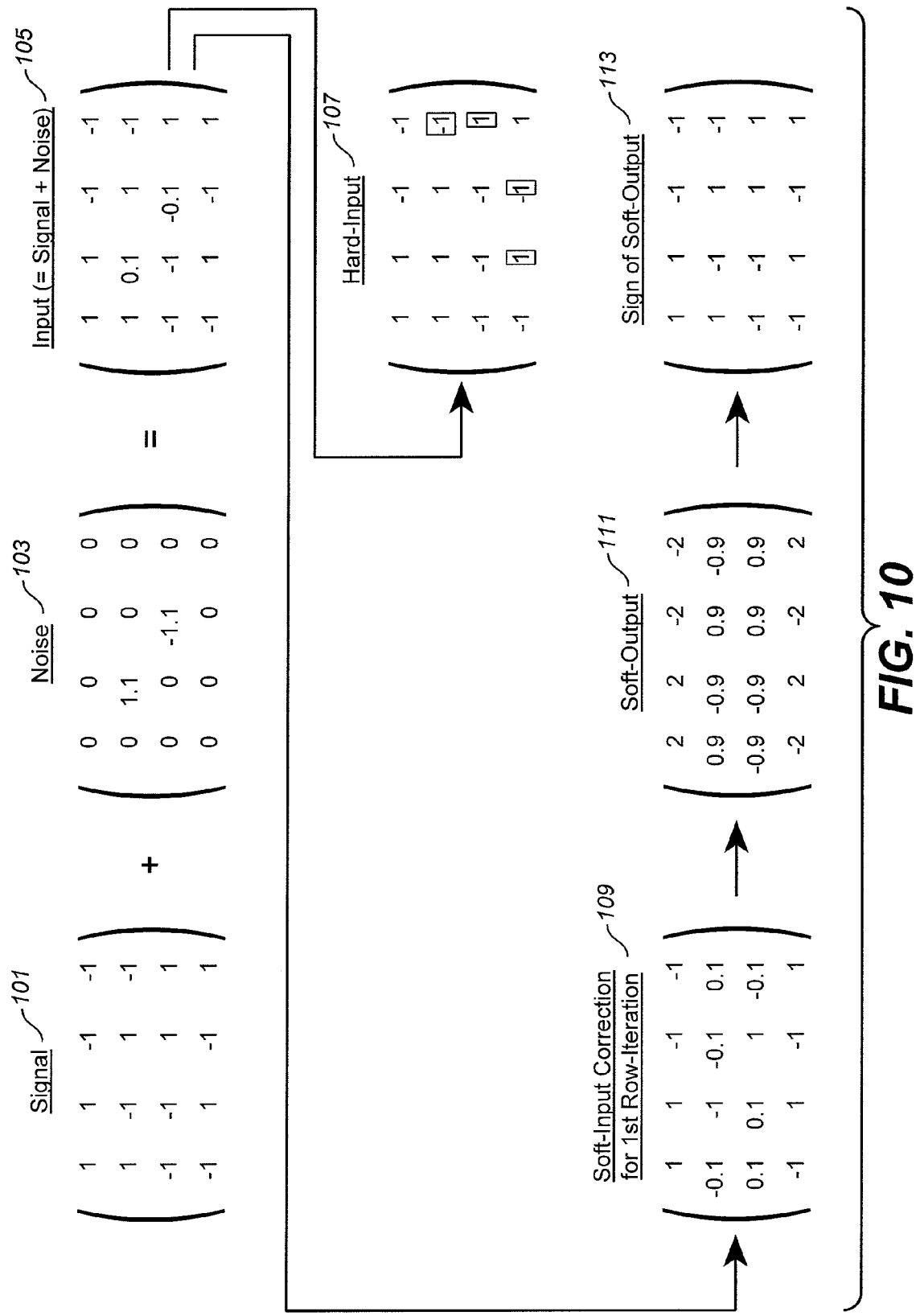
FIG. 10 shows a particular example of a signal that is subject to noise causing errors in data that are not correctable using a hard-input decoder but are correctable using a SISO decoder.

FIG. 10 shows the outcome when the data encoded as shown in FIG. 9 is later decoded in both a hard-input hard-output decoder and in a SISO decoder. In this example, the two logical states of a binary system are represented by −1 and +1 instead of 0 and 1 respectively. It will be understood that any suitable notation may be used and this notation is simply convenient for this example. For soft numbers, the sign indicates whether the bit is most likely a 0 or a 1 and the magnitude of the number indicates the likelihood that this is the correct value.

A signal 101 is shown as a group of bits that include data bits and parity bits calculated according to the encoding scheme of FIG. 9. The signal is generally the output of an encoder that has suitable circuits to calculate parity bits. The signal may be sent to a modulator which then provides suitable voltages to memory cells to program the memory cells to states to record the signal data.

Noise 103 is shown affecting two data bits in this example. Noise is not limited to data bits and may also affect parity bits. Noise may be the result of some physical characteristic of particular cells or may be the result of disturbs that occur in memory when one cell is affected by operations carried out on other cells in the array. In this example, noise is considered additive so that data read from the memory reflects the signal data plus the noise, which then becomes the input data for decoding. But noise may have either positive or negative effects on the read value.

Input 105 is the raw data obtained from a demodulator connected to a memory. For example, where a read operation is performed with a high resolution, input data may be generated in this form so that a bit of either signal or parity data is represented by 0.1 instead of a 1 or a 0. This may be considered a likelihood value with a positive value indicating a 1 and a negative value indicating a 0, the magnitude of the value indicating the likelihood that the indicated state is correct. Input 105 may be considered a soft-input because it includes more than a simple 0 or 1 value.

For a hard-input hard-output decoder, input 105 is converted to hard input 107 by replacing all positive values by +1 and replacing all negative values by −1. In a system using one's complement (1's complement) logic to represent the soft-input likelihood values, the most significant bit represents the sign and may be used as the means of conversion. The hard-input hard-output decoder may attempt to correct the data using this hard input. However, parity calculations indicate an error in each of the second and third rows and an error in each of the second and third columns. There is no unique solution in this situation because D22 and D33 could be in error or alternatively D32 and D23 could be in error. The hard-input hard-output detector cannot determine which of these solutions is correct. Therefore, a hard-input hard-output decoder is unable to correct the data in this situation In a first SISO decoding step, soft-input correction data 109 is generated for the first row from the input. Each entry of soft-input correction data 109 is calculated from the sign of the product of the other entries in the same row and the magnitude of the smallest entry in the row (calculation of likelihood values is described in more detail below). This gives an indication of what the other entries in the row indicate the entry should be and may be considered a calculated likelihood or an extrinsic likelihood (as opposed to the intrinsic likelihood of the Input). The soft-input correction data 109 is then added to Input 105 to obtain the soft-output 111 of the first row-iteration. The soft-output 111 of the first row-iteration thus combines the intrinsic and extrinsic likelihood values. The soft-output reflects both intrinsic likelihood information from the raw data and extrinsic likelihood information derived from the other entries in the same row that share the same parity bit. Looking at the sign of the soft-output 113 at this point (converting the soft-output to a hard-output) shows that the data is fully corrected. Thus, the soft-input soft-output decoding can correct this data where a hard-input hard-output decoder could not. Furthermore, the soft-input soft-output decoder can make this correction in one iteration using only row parity calculations. If correction was not completed, then further calculations could be performed using column parity calculations. If such a first column-iteration did not provide full correction, then a second row-iteration could be performed. Thus, a SISO may continue to work towards a solution where a hard-input decoder stops without finding a solution.

A second example is shown in FIG. 11. As in the previous example, parity bits are calculated for both rows and columns of the input data (just two input data entries per row or column in this example). Here parity bits are calculated to be the sum modulo 2 of the input data bits of the row or column.

FIG. 12 shows the input data being received by an encoder 121 in an ECC unit 123 that calculates the parity bits and appends them to the data. In this case, four bits of parity data are appended to four bits of input data. The input data and parity bits thus form encoded signal data that is sent to a modulator 125. Modulator 125 programs individual memory cells according to the signal data. In this case, two bits are stored in a memory cell of memory array 126, so the eight bits of signal data are stored in four cells having respective threshold voltage levels V1-V4. Subsequently the memory cells are read as having threshold voltage ranges V1'-V4'. The read threshold voltage ranges are demodulated in a demodulator 127 to provide raw likelihood data (1.5, 1.0, 0.2, 0.3, 2.5, 2.0, 6.0, 1.0). This may be obtained using a lookup table or otherwise. In some cases, providing raw likelihood data is considered as a function within a decoder, but for the present case it is considered as taking place within demodulator 127. A raw likelihood value is obtained for each bit so that even though bits are stored in the same cell, they may have different raw likelihood values. In the present example, demodulator 127 provides likelihood values as Log Likelihood Ratio values, though likelihood may be expressed in other formats also. The raw likelihood values are positive for all data entries indicating that, if a hard-output was obtained directly from these entries, all data entries would be considered to be 1s at this point (providing two errors). However, using a SISO decoder 129 in ECC unit 123, the data may be fully corrected. FIGS. 13A-13D show how SISO decoder 129 corrects input data. Decoder 129 is a particular example of a SISO decoder that may be used in a memory system such as memory system 421 (decoder 129 may be used as decoder 429)

Figure 13A:
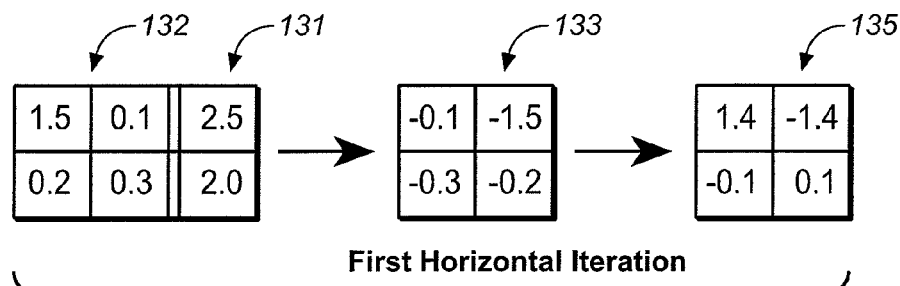
FIG. 13A shows a first horizontal iteration performed by the SISO decoder of FIG. 12.

FIG. 13A shows a first horizontal iteration using row parity bits 131 to obtain first calculated likelihood values 133 from row likelihood values 132. In this case, LLRs are added to obtain calculated likelihood values 133. It can be shown that the sum of two LLRs in this example is given by the product of the signs of the two LLRs and (−1), multiplied by the smaller LLR value.

$$LLR(D1) \oplus LLR(D2) \approx (-1) \times sgn[LLR(D1)] \times sgn[LLR(D2)] \times min[LLR(D1), LLR(D2)]$$

Where $\oplus$ indicates LLR addition. Applying this LLR addition to the entries provides calculated likelihood values shown. For example, the calculated likelihood corresponding to entry $D_{11}$ is 0.1⊕2.5≈−0.1, the calculated likelihood corresponding to entry $D_{12}$ is 1.5⊕2.5≈−1.5. Calculated (extrinsic) likelihood values 133 are then added to the raw (intrinsic) likelihood values 132 to obtain output likelihood values 135 from the first horizontal iteration. So the output likelihood value corresponding to entry D11 is the raw likelihood value 1.5 plus the calculated likelihood value −0.1, giving 1.4. As can be seen, the output likelihood values 135 of the top row (1.4, −1.4) indicate relatively high likelihood values indicating that the correct bits are 1 and 0. However, likelihood values 135 on the bottom row (−0.1, 0.1) indicate low likelihood values that the bits are 0 and 1 respectively. These likelihood values indicate the correct input bits. However, such low likelihood values may not be considered good enough to terminate decoding at this point. So, additional iterations may be performed.

Figure 13B:
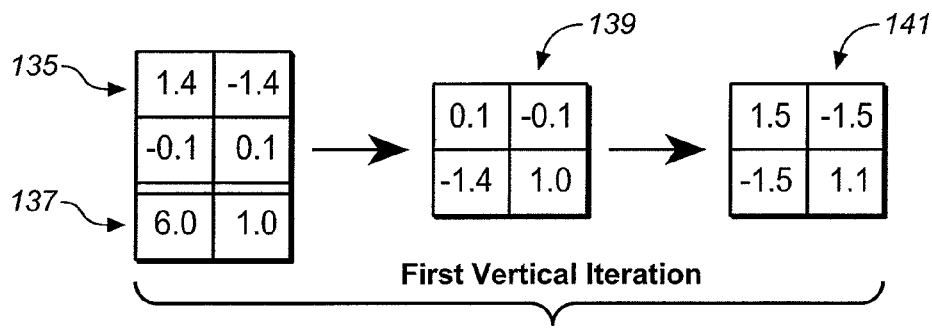
FIG. 13B shows a first vertical iteration performed by the SISO decoder of FIG. 12.

FIG. 13B shows the output likelihood values 135 from the first horizontal iteration being subjected to a first vertical iteration using column parity bits 137. Calculated likelihood values 139 of the first vertical iteration are calculated in the same manner as before, this time along columns using column parity entries 137. Thus, D11 is obtained from the LLR sum of D12 and P3 (−0.1 and 6.0, giving 0.1). D12 is obtained from the LLR sum of D11 and P3 (1.4 and 6.0, giving −1.4). In this way, calculated likelihood values 139 are obtained for each entry. Next, the calculated (extrinsic) likelihood values 139 are added to the input likelihood values 135 (the output likelihood values of the first horizontal iteration) to obtain output likelihood values 141 of the first vertical iteration. The output likelihood values 141 obtained from the first vertical iteration (1.5, −1.5, −1.5, 1.1) may be considered sufficiently good to terminate decoding at this point. However, depending on the predetermined condition required to terminate decoding, more decoding iterations may be performed.

Figure 13C:
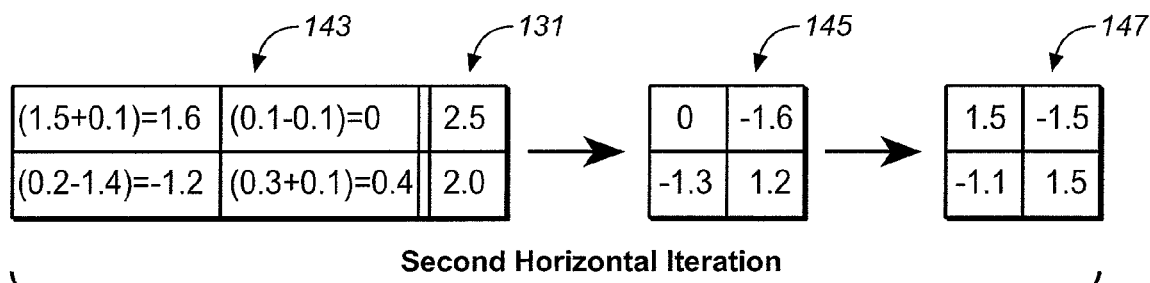
FIG. 13C shows a second horizontal iteration performed by the SISO decoder of FIG. 12.

FIG. 13C shows a second horizontal iteration being performed. The calculated likelihood values 139 from the first vertical iteration are first added to the raw likelihood values 132 to obtain input values 143. The input values 143 are then used with row parity entries 131 as before to obtain second horizontal calculated likelihood values 145. The second horizontal likelihood values 145 are then added to the input values 132 to obtain the output likelihood values 147 of the second horizontal iteration. The output likelihood values 147 of the second horizontal iteration do not provide an overall improvement in likelihood values from the output of the first vertical iteration.

Figure 13D:
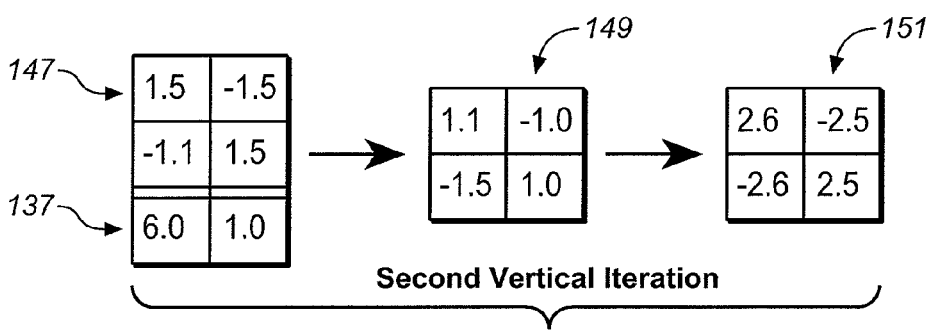
FIG. 13D shows a second vertical iteration performed by the SISO decoder of FIG. 12.

FIG. 13D shows a second vertical iteration being performed. The output values 147 from the second horizontal iteration are used as input values for this iteration. Column parity entries 137 are used with the input values to obtain calculated likelihood values 149 as before. Calculated likelihood values 149 are then added to the input likelihood values 147 to obtain output likelihood values 151. Output values 151 from the second vertical iteration are shown to be improved compared with output values 141 from the first vertical iteration. Thus, it can be seen that additional iterations may provide additional improvement in the data.

Iterative decoding may cycle through iterations until some predetermined condition is met. For example, the predetermined condition may be that each likelihood value in an output set of likelihood values exceeds some minimum likelihood value. Alternatively, the predetermined condition may be some parameter derived from more than one likelihood value, such as a mean or average likelihood. The predetermined condition may simply be that a certain number of iterations are preformed. In some cases (discussed later) a SISO decoder provides output likelihood values that are then subject to another operation that indicates whether additional SISO iterations should be performed or not.

The example of FIGS. 13A-13D may be considered an example of a technique known as Turbo decoding. Horizontal and vertical parity bits provide two alternative encoding schemes that can be separately decoded. Using two such decoding schemes together and using the output from one decoding scheme as the input for the other, turbo coding generally provides high error correction capability.

Efficient decoding depends on having a suitable encoding/decoding scheme. Various schemes are known for encoding data in a manner that is suitable for subsequent decoding in a SISO decoder. Encoding/decoding schemes include, but are not limited to, turbo codes, product codes, BCH codes, Reed-Solomon codes, convolutional codes (see U.S. patent application Ser. Nos. 11/383,401 and 11/383,405), Hamming codes, and Low Density Parity Check (LDPC) codes.

Figures 14, 15:
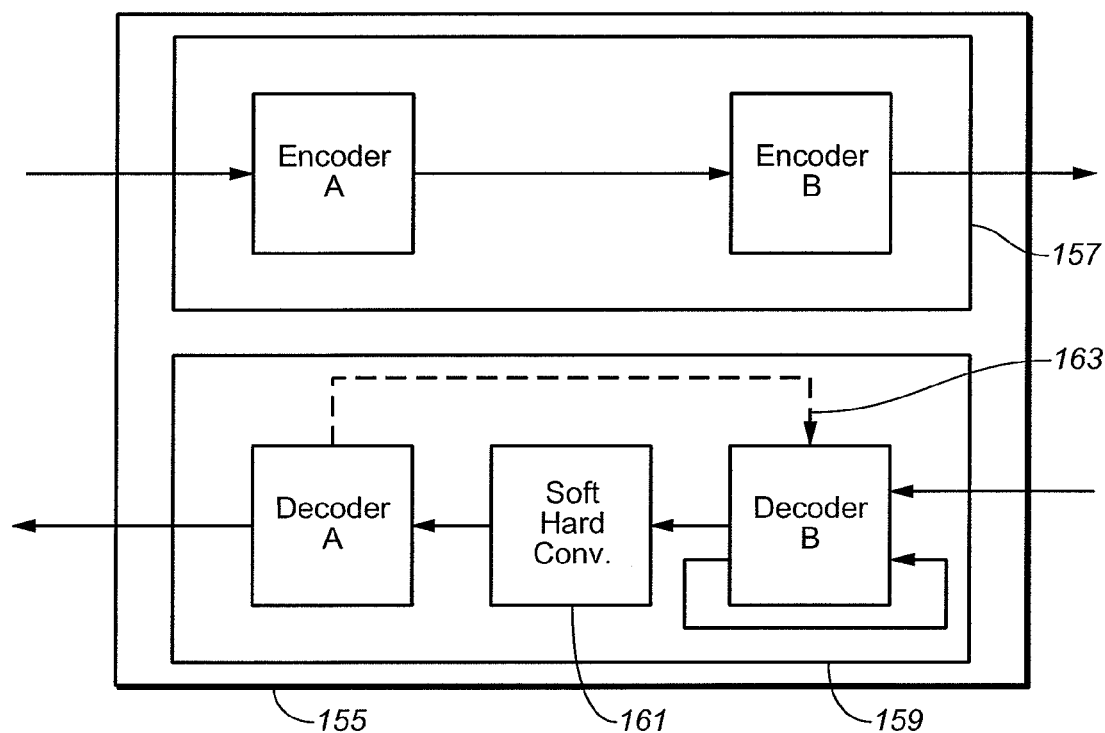
FIG. 14 shows a Low Density Parity Check (LDPC) parity check matrix used in a SISO decoder.
FIG. 15 shows an encoder/decoder having concatenated encoders and having concatenated decoders.

LDPC codes are codes that have a parity check matrix that meets certain requirements, resulting in a sparse parity check matrix. This means that each parity check is performed over a relatively small number of bits. An example of a parity check matrix H for an LDPC code is shown in FIG. 14. The conditions for an LDPC code are: (1) The number of is in each row is the same and the number is small in comparison to the total number of entries in the row. (2) The number of 1s in each column is the same and the number is small in comparison with the total number of entries in the column. (3) The number of Is in common between any two columns is not greater than 1 (the number of is in common may only be zero or one). Irregular LDPC codes allow some deviation in the number of 1s in columns and rows. Looking at H, each row has three 1s, out of a total of seven entries in a row, so that condition (1) is met. Each column has three 1s, out of a total of seven entries in a column, so that condition (2) is met. No two columns have more than one 1 in common, so that condition (3) is met. For example, the first, second and fourth columns all have a 1 as the top entry, but none of these columns has another 1 in common. Thus, matrix H defines an LDPC code. The code consists of all code words that satisfy matrix H. This means that seven different parity check conditions (defined by the seven rows) must be met. Each parity check condition looks at three entries in a word. For example, the first row indicates that the first, second and fourth entries in a word must have a sum modulo two of zero.

Data may be encoded according to an LDPC code by calculating certain parity bits to form a codeword. Thus, a codeword of the parity check matrix H may be formed of four data bits and three parity bits calculated from the four data bits. Each parity bit is calculated from a relatively small number of data bits, so encoding may be relatively simple, even where a large number of entries are encoded as a block.

A suitable LDPC code for memory applications uses a word of about 4,000-8,000 bits (1-2 sectors, where a sector is 512 bytes). For example, encoding according to the LDPC code may add approximately 12% to the unencoded data. The number of 1s in a row of a parity check matrix for such a code may be about 32 out of about 4000, so that even though the word is large, the parity calculations are not excessively long. Thus, parity bits may be relatively easily calculated during encoding and parity may also be relatively easily checked during decoding. LDPC codes may be used with hard-input hard-output decoding or SISO decoding. As shown earlier, SISO decoding can sometimes improve performance over hard-input hard-output decoding. Raw likelihood values may be supplied to a SISO decoder as LLRs or in some other form. An LDPC can use a SISO decoder in an iterative manner. An entry is common to several parity groups so that a calculated likelihood value obtained from one group provides improved data for another parity group. Such calculations may be iteratively performed until some predetermined condition is met.

LDPC decoding may sometimes provide poor results when the number of errors is very low. Correcting errors below a certain number becomes difficult creating an "error floor." One solution to this problem is to combine LDPC decoding with some other form of decoding. A hard-input hard-output decoder using BCH or some similar algebraic code may be added to an LDPC decoder. Thus, the LDPC decoder reduces the number of errors to some low level, and then the BCH decoder decodes the remaining errors. Decoders operating in series in this manner are referred to as "concatenated." Concatenated encoding is also performed before data is stored in the memory array in this case.

FIG. 15 shows an example of concatenated encoding and decoding in an ECC unit 155 that includes an encoding system 157 and a decoding system 159. Data is received by the ECC unit 155 and is first encoded in encoder A where it is encoded according to encoding scheme A. Then, the encoded data is sent to encoder B where it is encoded according to encoding scheme B. In the present example, encoding scheme A is a BCH encoding scheme that adds parity bits to the input data, increasing the amount of data by approximately 4% in one example. Encoding scheme B is an LDPC encoding scheme that adds additional parity bits to the encoded data from encoder A, adding an additional 12% to the data in this example. The doubly encoded data is then send to a modulation/demodulation unit and is programmed to a nonvolatile memory array. Subsequently, the doubly encoded data is read from the memory array and is demodulated to provide a soft-input to decoder B. Decoder B decodes data using encoding scheme B. Similarly, decoder A uses encoding scheme A. Decoder B of this example is a SISO decoder that performs one or more decoding iterations on the doubly encoded data. When some predetermined condition is met, decoder B sends output data to decoder A. The output data from decoder B does not generally include entries for parity bits added by encoder B. These entries have already been used by decoder B and are no longer necessary. The output of decoder B is a soft-output. This soft output may be converted to a hard-data in a soft-hard converter 161 that removes likelihood information and converts the data to binary information. This hard data is then provided as a hard-input to decoder A which performs hard-input, hard-output decoding. The hard-output from the second decoder is then sent out of ECC unit 155 as corrected data.

In one embodiment, the predetermined condition for terminating iterative decoding in decoder B is that decoder A indicates that the data is good. After an iteration is completed in decoder B, a soft-output may be converted to hard data and provided as a hard-input to decoder A. Decoder A then attempts to decode the data. If decoder A cannot decode the data, then decoder B performs at least one additional iteration. If decoder A can decode the data, then no more iterations are required in decoder B. Thus, in this example, decoder A provides a feedback 163 to decoder B to indicate when the decoder B should terminate.

While the example of FIG. 15 deals with concatenation of hard-input hard-output and SISO coding, other combinations may also be used. Two or more SISO decoders may be used in series and two or more hard-input hard-output decoders may also be used.

Soft-input in the examples described above is obtained by reading data with a higher resolution than was used to program the data. In other examples, other information may be used to derive soft-input data. Any quality information provided in addition to a simple 1 or 0 determination regarding a data bit stored in memory may be used to provide a soft-input. In some memory designs, a count is maintained of the number of times a block has been erased. Physical properties of the memory may change in a predictable manner as erase count increases, making certain errors more likely. An erase count may be used to obtain likelihood data where such a pattern is known. Other factors known to affect programmed data in a predictable way may also be used to obtain likelihood information. In this way, data may be read from the memory array with the same resolution used to program it and still be used to provide a soft-input. Various sources of likelihood information may be combined. Thus, likelihood information from reading data with a high resolution may be combined with likelihood data from another source. Thus, a soft-input is not limited to likelihood information obtained directly from reading the memory array.

The various examples above refer to flash memory. However, various other nonvolatile memories are currently in use and the techniques described here may be applied to any suitable nonvolatile memory systems. Such memory systems may include, but are not limited to, memory systems based on ferroelectric storage (FRAM or FeRAM), memory systems based on magnetoresistive storage (MRAM), and memories based on phase change (PRAM or "OUM" for "Ovonic Unified Memory").

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A nonvolatile memory system comprising:
a memory array including a plurality of cells for storing a modulated plurality of data bits and a plurality of parity bits that are calculated from the plurality of data bits according to an encoding scheme;
a demodulator for reading the plurality of cells and deriving raw likelihood values corresponding to the plurality of data bits and the plurality of parity bits, wherein the demodulator is further operable to read each memory cell using a predetermined pattern of read operations, the pattern having at least one area of higher density and one area of lower density; and
a decoder for receiving the raw likelihood values and calculating output likelihood values therefrom using a decoding scheme that corresponds to the encoding scheme.

2. The nonvolatile memory system of claim 1 wherein the demodulator is further operable to resolve a number of read states per cell that is greater than the number of program states used to program the plurality of cells.

3. The nonvolatile memory system of claim 1 wherein the encoding scheme uses turbo coding.

4. The nonvolatile memory system of claim 1 wherein the encoding scheme uses a Low Density Parity Check (LDPC) code.

5. The nonvolatile memory system of claim 1 further comprising a converter for converting a soft input to a hard output.

6. The nonvolatile memory system of claim 1 wherein the decoder is further operable to subsequently calculate additional likelihood values from the output likelihood values using the decoding scheme.

7. The nonvolatile memory system of claim 6 wherein the decoder is further operable to calculate additional likelihood values in two or more iterations, the iterations performed until a predetermined condition is met.

8. The nonvolatile memory system of claim 7 further comprising a hard-input hard-output decoder for receiving the output likelihood values from the decoder, the hard-input hard-output decoder being configured for determining when the predetermined condition is met.

9. A nonvolatile memory system comprising:
a nonvolatile memory array for storing two or more bits in an individual memory cell; and
a demodulator for deriving an individual likelihood value for each of the two or more bits stored in the individual memory cell,
wherein the demodulator is operable to read the individual memory cell using a predetermined pattern of read operations, the pattern having at least one area of higher density and one area of lower density.

10. The nonvolatile memory system of claim 9 further comprising a lookup table for storing the individual likelihood values for each of the two or more bits.

11. The nonvolatile memory system of claim 9 wherein the two or more bits include at least one parity bit that was added according to an encoding scheme.

12. The nonvolatile memory system of claim 9 wherein the demodulator is further operable to derive the individual likelihood values by reading the individual memory cell with a resolution that identifies more than the number of program states of the individual memory cell.

13. The nonvolatile memory system of claim 9 further comprising a soft-input soft-output decoder for receiving the individual likelihood values as input and calculating output likelihood values from the individual likelihood values.

14. A nonvolatile memory system comprising:
an array of nonvolatile memory cells for individually programming to one of two or more threshold voltage ranges that represent two or more states; and
a demodulator for resolving an individual cell threshold voltage to an identified one of the two or more threshold voltage ranges and further resolving the individual cell threshold voltage within the identified threshold voltage range by providing a higher density of read operations for a first portion of the identified threshold voltage range than at for a second portion of the identified threshold voltage range, the demodulator being further configured for deriving likelihood values from the read operations for the first and second portions.

15. The nonvolatile memory system of claim 14 further comprising a soft-input soft-output decoder for receiving the likelihood values as input.

16. The nonvolatile memory system of claim 15 wherein the soft-input soft-output decoder is further operable to calculate output likelihood values in multiple iterations until a predetermined condition is met.

17. The nonvolatile memory system of claim 16 further comprising a soft-hard converter for converting the output likelihood values to hard output values when the predetermined condition is met.

18. The nonvolatile memory system of claim 16 further comprising a hard-input hard-output decoder for receiving the output likelihood values from the soft-input soft-output decoder, the hard-input hard-output decoder being configured for determining when the predetermined condition is met.

19. The nonvolatile memory system of claim 14 wherein nonvolatile memory cells are further individually programmable to four or more threshold voltage ranges that represent four or more states to store two or more bits, the demodulator being configured for deriving likelihood values for each of the two or more bits.

* * * * *